US006884934B2

(12) United States Patent
Tsuzuki et al.

(10) Patent No.: US 6,884,934 B2
(45) **Date of Patent: *Apr. 26, 2005**

(54) SOLAR-BATTERY ARRAY, AND PHOTOVOLTAIC POWER GENERATION SYSTEM

(75) Inventors: Hidetoshi Tsuzuki, Kanagawa (JP); Akiharu Takabayashi, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 185 days.

This patent is subject to a terminal disclaimer.

(21) Appl. No.: 10/157,144

(22) Filed: May 30, 2002

(65) Prior Publication Data

US 2003/0010373 A1 Jan. 16, 2003

(30) Foreign Application Priority Data

May 31, 2001 (JP) ....................................... 2001/164355

(51) Int. Cl.[7] ........................... H02J 7/35; H01L 31/042

(52) U.S. Cl. ....................... 136/244; 136/291; 136/293; 136/251; 323/906; 310/303; 320/101; 60/641.8

(58) Field of Search ................................ 136/244, 291, 136/293, 251; 323/906; 310/303; 320/101; 60/641.8

(56) References Cited

U.S. PATENT DOCUMENTS 3,151,379 A * 10/1964 Escoffery ..................... 438/80
3,330,700 A * 7/1967 Golub et al. ................ 136/244
4,341,607 A 7/1982 Tison ......................... 204/129
5,538,692 A 7/1996 Joannou ..................... 422/121
5,590,495 A * 1/1997 Bressler et al. ............ 52/173.3
5,627,414 A 5/1997 Brown et al. ................. 307/95
6,280,344 B1 * 8/2001 Robb ......................... 473/125
6,703,555 B1 * 3/2004 Takabayashi et al. ....... 136/244
2001/0048605 A1 * 12/2001 Kurokami et al. ....... 363/56.03
2002/0195136 A1 * 12/2002 Takabayashi et al. ....... 136/244
2003/0075211 A1 * 4/2003 Makita et al. .............. 136/244

FOREIGN PATENT DOCUMENTS

| EP | 1 032 050 A2 | 8/2000 |
|---|---|---|
| JP | 02-39506 | 2/1990 |
| JP | 03-153008 | 7/1991 |

OTHER PUBLICATIONS

IEEE Guide to Terrestrial Photovoltaic Power System Safety (IEEE Standard 1374–1998), 1998.*
Derwen Abstract No. 2001–206289, 1–2001.*
IEC: "technical report," Effects of Current on Human Beings And Livestock (1994), vol. 3, pp. 1–66.

* cited by examiner

*Primary Examiner*—Alan Diamond
(74) *Attorney, Agent, or Firm*—Fitzpatrick, Cella, Harper and Scinto

(57) ABSTRACT

A solar-battery array comprising a plurality of solar batteries, which is characterized by satisfying the relationship of $V_2<0$ and $V_1+V_2>0$, where $V_1$ is the voltage to ground of the positive-pole terminal at the time of maximum output of the solar-battery array, and $V_2$ is the voltage to ground of the negative-pole terminal at the time of maximum output of the same and a photovoltaic power generation system having such an array are disclosed, whereby the effects of an electric shock on the human body can lessen even when you touch any electric circuit of the solar-battery arrays.

16 Claims, 6 Drawing Sheets

200 104 500 103 100 100 101 102

SOLAR-BATTERY ARRAY, AND PHOTOVOLTAIC POWER GENERATION SYSTEM

BACKGROUND OF THE INVENTION

1. Field of the Invention

This invention relates to a solar-battery array comprising a plurality of solar batteries, and a photovoltaic power generation system having such a solar-battery array.

2. Related Background Art

In recent years, photovoltaic power generation systems have attracted notice as clean and new energy supply means. When they are used as power sources of outdoor signs or power sources of watches or clocks, in some cases a single solar cell (or a solar-cell module) and a secondary battery are combined to set up a photovoltaic power generation system. When, however, the photovoltaic power generation systems are employed in public institutional buildings, general houses, power plants and so forth, it is common to design a photovoltaic power generation system with an electric power of several kilowatts (kW) or more. On the other hand, the electric power per one solar cell or solar-cell module is usually several watts (W) to hundreds of W. Hence, in the photovoltaic power generation system for providing an electric power of several kW or more, it is common to use a solar-battery array consisting of a plurality of solar batteries.

Incidentally, those in which a plurality of solar batteries are connected in series are commonly called a solar-battery string and those in which a plurality of solar batteries or solar-battery strings are connected in parallel are often called solar-battery arrays in a narrow sense. In the present specification, when simply "solar-battery array" is termed, it is a concept which embraces the solar-battery string.

Also when simply "solar battery" is termed in the present specification, it is a concept which embraces both the solar cell and the solar-cell module. In the present specification, the "solar cell" is the smallest constituent unit of a device having the function of photoelectric conversion, and is meant to be such a unit that a photoelectric conversion device with a smaller electromotive force is substantially unable to be taken out without destroying the part pertaining to photoelectric conversion (usually, semiconductor layers) of the unit. Meanwhile, in the present specification, the term "solar-cell module" refers to a component in which a plurality of solar cells are electrically connected (e.g., connected in series or connected in parallel) into an integral body. To distinguish the "solar cell" from the "solar-cell module" is not essential in the most of the invention described in the present specification. Accordingly, the term "solar battery" is used as a concept which represents these collectively. As for the invention in which it has a meaning to distinguish them will be described later.

Now, in the large-power photovoltaic power generation system as stated above, there is risk of receiving an electric shock on touch with its electric circuit. In usual photovoltaic power generation systems, such an electric circuit is covered or the surroundings of power generation systems are forbidden to enter, to provide a countermeasure for the electric shock. However, if any covering material which covers the electric circuit is broken or when any execution or maintenance is performed, you may accidentally touch the electric circuit.

Meanwhile, as a method of lessening the effects on human bodies if you touch the electric circuit of a solar-cell array, a method is available in which e.g., a transformer (insulation transformer) is used to make perfect insulation between the whole electric circuits of the array and the ground (bring them into a state of floating) so that any loop of electric current may not be formed if you touch the electric circuit. Even in such a case, however, the effects on human bodies can not be controlled if you touch a different part of the electric circuit in the state a ground fault has unintentionally been formed at some part of the electric circuit.

SUMMARY OF THE INVENTION

Accordingly, an object of the present invention is provide a solar-battery array, and a photovoltaic power generation system, which may have less effects of an electric shock on human bodies even if you touch the electric circuit.

To achieve the above object, the present invention provides a solar-battery array comprising a plurality of solar batteries, which solar-battery array satisfies the relationship of $V_2<0$ and $V_1+V_2>0$, where $V_1$ is the voltage to ground of the positive-pole terminal (of the solar-battery array) at the time of maximum output of the solar-battery array, and $V_2$ is the voltage to ground of the negative-pole terminal (of the solar-battery array) at the time of maximum output of the solar-battery array.

In a preferred embodiment of the array, it satisfies the relationship of $V_1+2V_2=0$. An embodiment is also preferred in which a point at which the voltage to ground is 0 is present on an electric circuit which is not inside the solar battery, and the absolute value of $V_1+2V_2$ is not more than the absolute value of $V_1+2V_2$ found when the voltage to ground of any other point on an electric circuit which is not inside the solar battery is 0. This embodiment is, in other words, an embodiment which is so set that the absolute value of $V_1+2V_2$ may become smallest on the condition that the voltage to ground of the point on the electric circuit which is not inside the solar battery is set to be 0. Still also preferred is an embodiment which is so set that the potential difference between positive pole and negative pole at the time of maximum output of an individual solar battery which constitutes the solar-battery array is $V_3$ and satisfies the relationship of $V_1+2V_2-2V_3\leqq 0\leqq V_1+2V_2+V_3$. The array may preferably be grounded at the point at which the voltage to ground is 0.

The present invention also provides a photovoltaic power generation system having the solar-battery array described above, and a load and/or an inverter which changes direct-current output of the solar-cell array to alternating-current output; the load and/or the inverter being connected to the positive-pole terminal and negative-pole terminal of the solar-cell array.

The present invention still also provides a photovoltaic power generation system having a solar-battery array comprising a plurality of solar batteries, and an inverter which is connected to the solar cells and changes direct-current output of the solar-battery array to alternating-current output, wherein the solar-battery array has a point at which the voltage to ground at the time of maximum output of the solar-battery array is 0 V; the point being located between the negative-pole terminal of the solar-battery array and the electrical middle point of the solar-battery array at the time of its maximum output.

DESCRIPTION OF THE PREFERRED EMBODIMENTS

A preferred embodiment of the present invention is a solar-battery array, or a photovoltaic power generation system, which is so designed as to lessen any effects an electric shock may have on the heart when your hand touches some part of the electric circuit of a solar-battery array. Then, a solar-battery array, or a photovoltaic power generation system, which can keep such effects minimum is the most preferred embodiment of the present invention.

According to the IEC (International Electrotechnical Commission) standard 60479-1, it has been ascertained from the results of an experiment on animals that the threshold value at which the fibrillation occurs when direct current flows from the upper part to the lower part of an animal is about twofold the threshold value at which the fibrillation occurs when direct current flows from the lower part to the upper part of the animal. The present inventors have considered that such relationship applies also to human bodies.

Figure 1:
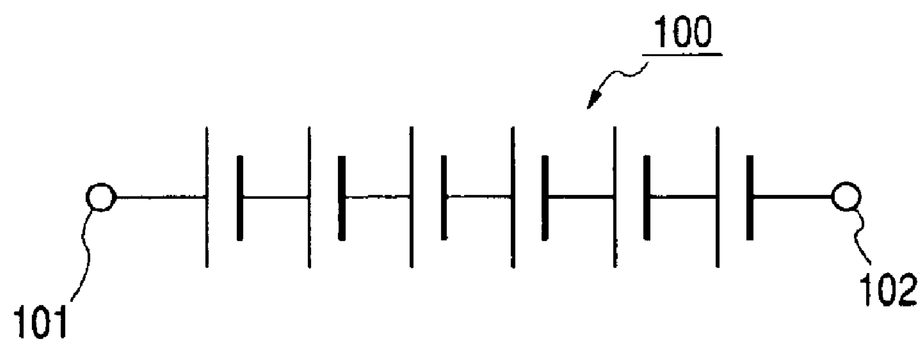
FIG. 1 is a diagrammatic view showing an example of a solar-battery string, which is an illustration for describing the outline of the present invention.

A solar-battery string 100 in which a plurality of solar batteries are connected in series is shown in FIG. 1 as an example of a solar-battery array. In the solar-battery string shown in FIG. 1, the voltage to ground of a positive-pole terminal 101 at the time of maximum output is represented by $V_1$, and the voltage to ground of a negative-pole terminal 102 at the time of maximum output by $V_2$. Here, studies are made on direct current which flows through the human body and any effects the direct current may have on the heart in a case in which, in the state you stand on the ground, your hand touches any point (a point) between the positive-pole terminal and the negative-pole terminal (or a point at terminal 101, 102) on an electric circuit when the solar-battery string 100 is kept at maximum output.

Representing as R the direct-current resistance between the hand and the sole of the foot of the human body, where the relationship of $V_1 \geqq 0 \geqq V_2$ (provided that $V_1 > V_2$) is satisfied, the maximum value of the direct current flowing through the human body from the sole of the foot to the hand (from the lower part to the upper part) comes to $-V_2/R$, and the maximum value of the direct current flowing through the human body from the hand to the sole of the foot (from the upper part to the lower part) comes to $V_1/R$. Here, the magnitude of effects the direct current may have on the heart in each case is represented by a virtual parameter Eff., the Eff. in each case is given by $aV_1/R$ and $-2aV_2/R$, respectively, (a is a proportional constant).

A preferred embodiment of the present invention is a construction that the maximum value of the Eff. is set to be small. The maximum value of the Eff. is meant to be the value of Eff. found when your hand touches a point in the string at which the Eff. is the greatest.

Assume that the voltage to ground of the positive-pole terminal, $V_1$, is set to be 0 by, e.g., grounding the positive-pole terminal 101, the Eff. comes to a maximum when your hand touches the negative-pole terminal, and the maximum value of the Eff. comes to $-2aV_2/R$. On the other hand, where the voltage to ground of the negative-pole terminal, $V_2$, is set to be 0 by, e.g., grounding the negative-pole terminal 102, the Eff. comes to a maximum when your hand touches the positive-pole terminal, and the maximum value of the Eff. comes to $aV_1/R$. Also, where an electrical middle point between the positive-pole terminal and the negative-pole terminal is grounded and the voltage to ground of that point is set to be 0, it follows that $V_1=-V_2$. Hence, the Eff. comes to a maximum when your hand touches the negative-pole terminal and the maximum value of the Eff. comes to $-2aV_2/R$ ($=2aV_1/R$).

To generalize the foregoing, the maximum value of the Eff. where it is so made as to be $kV_1+(1-k)V_2=0$ ($0 \leqq k \leqq 1$) comes to $aV_1/R$ when $0 \leqq k \leqq 1/3$ and comes to $-2aV_2/R$ when $1/3 \leqq k \leqq 1$.

Usually, the solar-battery string is so designed that the potential difference ($=V_1-V_2$) between the positive-pole terminal 101 and the negative-pole terminal 102 of the string 100 at the time of maximum output becomes constant ($=V_c$). When designed in this way, it follows that $kV_c+V_2=0$ ($0 \leqq k \leqq 1$) and $V_1-(1-k)V_c=0$ ($0 \leqq k \leqq 1$). Hence, the maximum value of the Eff. becomes $a(1-k)V_c/R$ when $0 \leqq k \leqq 1/3$, and becomes $2akV_c/R$ when $1/3 \leqq k \leqq 1$. Then, where it is set to be $0<k<1/2$, the maximum value of the Eff. can be made less than $aV_c/R$ (in other words, smaller than the value found when the voltage to ground of the ends of the string or at the electrical middle point is set to be 0). Then, $V_1+V_2>0$ and $V_2<0$ are obtained from $0<k<1/2$, $kV_1+(1-k)V_2=0$ and $V_1>V_2$.

Thus, where the voltage to ground of the positive-pole terminal and the voltage to ground of the negative-pole terminal both at the time of maximum output of the solar-battery string are represented by $V_1$ and $V_2$, respectively, the solar-cell string is so designed that the relationship of $V_1>0$, $V_2<0$ and $V_1+V_2>0$ is satisfied (however, it follows necessarily that $V_1>0$, as long as the relationship of $V_2<0$ and $V_1+V_2>0$ is satisfied). In other words, the solar-battery string is so designed that the voltage to ground of a point on the electric circuit, located between i) the electrical middle point between the positive-pole terminal and the negative-pole terminal and ii) the negative-pole terminal (except for the middle point and the negative-pole terminal), comes to 0.

The solar-battery string may be so designed as to satisfy such relations, whereby any effects an electric shock may have on the heart when your hand touches the electric circuit of the solar-battery string can be more lessened than the case when the voltage to ground of the ends or electrical middle point of the string 100 is merely set to be 0.

The simplest method for setting to be 0 the voltage to ground of the desired point on the electric circuit is grounding the electric circuit at its point where the voltage to ground should be set to be 0.

As another method, a method is available in which a means for fixing to a voltage other than 0 the voltage to ground of one point on the electric circuit (which may be a point outside the string) is provided so that the voltage to ground of the desired point on the electric circuit can be controlled to 0. In order to do so, a method is available in which one of the input terminals on the direct-current side of the inverter connected to the string (i.e., string-side input terminals) is fixed to a constant voltage to ground.

In the most preferred embodiment of the present invention, the point at which the voltage to ground comes to 0 is so determined as to satisfy k=⅓, i.e., $V_1+2V_2=0$. This can make the maximum value of the Eff. smallest.

However, a case is possible in which the point at which the voltage to ground comes to 0 so as to satisfy $V_1+V_2=0$ can not be selected because, e.g., the potential differences between positive poles and negative poles (not shown) at the time of maximum output of individual solar batteries (solar-cell modules or solar cells) constituting the solar-battery string are non-uniform, or because the number of solar batteries connected in series is not a multiple of 3. In such a case, it is the most preferred embodiment of the present invention that the point at which the voltage to ground comes to 0 is selected from points on the electric circuit which is outside the solar battery (solar-cell module or solar cell) so that the absolute value of $V_1+2V_2$ may come smallest. For example, where the potential difference between positive pole and negative pole at the time of maximum output of individual solar batteries constituting the solar-battery string are at constant values $V_3$ when any errors on manufacture are disregarded, the solar-battery string may preferably be so designed as to satisfy the relationship of $V_1+2V_2-2V_3 \leqq 0 \leqq V_1+2V_2+V_3$.

The same way of thinking as the above is also applicable to a case in which the potential differences between positive poles and negative poles at the time of maximum output of individual solar batteries are greatly non-uniform. More specifically, the point at which the potential at the time of maximum output comes to $(V_1+2V_2)/3$ in the solar-battery string may be calculated, and the potential difference between positive pole and negative pole at the time of maximum output of the solar batteries having this point, disregarding any errors on manufacture, may be regarded as $V_3$, and this $V_3$ is substituted for the above relationship.

The case in which a point on the electric circuit is grounded is described here, conceptionally distinguishing the solar cell from the solar-cell module.

As mentioned previously, the solar-cell module is a component in which a plurality of solar cells are electrically connected into an integral body. Then, in order to improve safety and weatherability, the electric circuit in the solar-cell module is covered with a resin, glass plate or a steel sheet in many cases. In such a case, it is difficult to ground the solar-cell module at a point on the electric circuit in the module to set the voltage to ground to be 0.

Accordingly, in the case when the grounding point is so determined as to satisfy the relationship of $V_1+2V_2-2V_3 \leqq 0 \leqq V_1+2V_2+V_3$ in a solar-battery string comprising a plurality of solar-cell modules, it is simple to design as $V_3$ the potential differences between positive poles and negative poles at the time of maximum output of the solar-cell modules, disregarding any errors on manufacture.

Meanwhile, where the solar-cell modules are not used (where solar cells themselves are connected-as they are, to form a solar-battery string), the potential differences between positive poles and negative poles at the time of maximum output of the solar cells, disregarding any errors on manufacture, should of course be designed as $V_3$.

Even in the case when the solar-battery string comprising a plurality of solar-cell modules is designed, too, the potential differences between positive poles and negative poles at the time of maximum output of the solar cells, disregarding any errors on manufacture, may be designed as $V_3$ when it is easy to ground the solar-cell module at a point on the electric circuit in the module or when the module is set up after the grounding point in the module is previously determined and a grounding wire is connected to the grounding point. This is preferred because the maximum value of the Eff. can be made much smaller.

Incidentally, not only the solar-battery string, but also a solar-battery array having a part connected in parallel may be designed in entirely the same way of thinking as the above.

(Embodiment 1)

Figure 2:
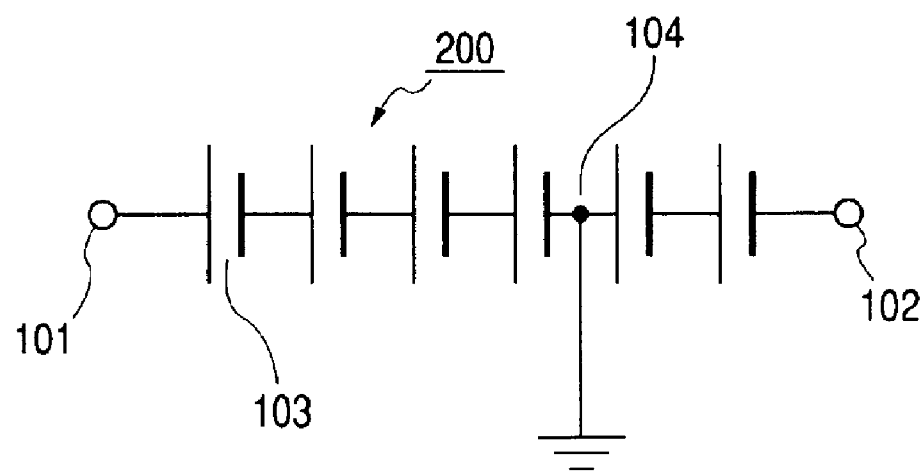
FIG. 2 is a diagrammatic view showing an example of a solar-battery string which is an example of the solar-battery array of the present invention.

A preferred embodiment of the present invention is shown in FIG. 2. A solar-battery string 200 shown in FIG. 2 is a string in which six solar-cell modules 103 which are so designed as to have the like output characteristics are connected in series, and has a positive-pole terminal 101 and a negative-pole terminal 102. As the solar-cell modules 103, it is preferable to use modules having bypass diodes. Also, the positive-pole terminal 101 and the negative-pole terminal 102 are optionally connected to a direct-current-side terminal or a load (both not shown).

In this Embodiment, the solar-battery string 200 is grounded at a point 104 on the electric circuit, located between modules which are second and third as counted from the negative-pole side of the string.

More specifically, in this Embodiment, as long as the outputs of the respective solar-cell modules are uniform, it satisfies $V_1+2V_2=0$, disregarding any errors on manufacture.

Thus, the maximum value of the Eff. at the time of maximum output can be made smallest, and any effects an electric shock may have on the heart when your hand touches some part of the electric circuit of the solar-battery string 200 can also be made smallest.

In the case when the solar-battery string is so constructed that one point on its electric circuit is grounded like this Embodiment, the maximum value of the Eff. can be made smallest as long as the output voltages of all the solar-cell modules are equal, even when the string is not at the maximum output. Also, even if the output voltages of some solar-cell modules have decreased because of partial shade or the like, the maximum value of the Eff. becomes smaller than that at the time of maximum output of the solar-battery string.

In the case when one point on the electric circuit is grounded like this Embodiment and where the positive-pole terminal of the string (or array) is connected to the direct-current-side terminal of the inverter, it is preferable to use a transformer (insulation transformer) built-in type inverter (insulation type inverter), or to provide a transformer (insulation transformer) on the alternating-current side of the inverter. This is because, if the transformer is not used, the voltage to ground of the positive-pole terminal or negative-pole terminal on the direct-current side may inevitably be fixed. Meanwhile, the voltage to ground of the desired point on the electric circuit can be set to be 0 by providing the transformer.

(Embodiment 2)

Figure 3:
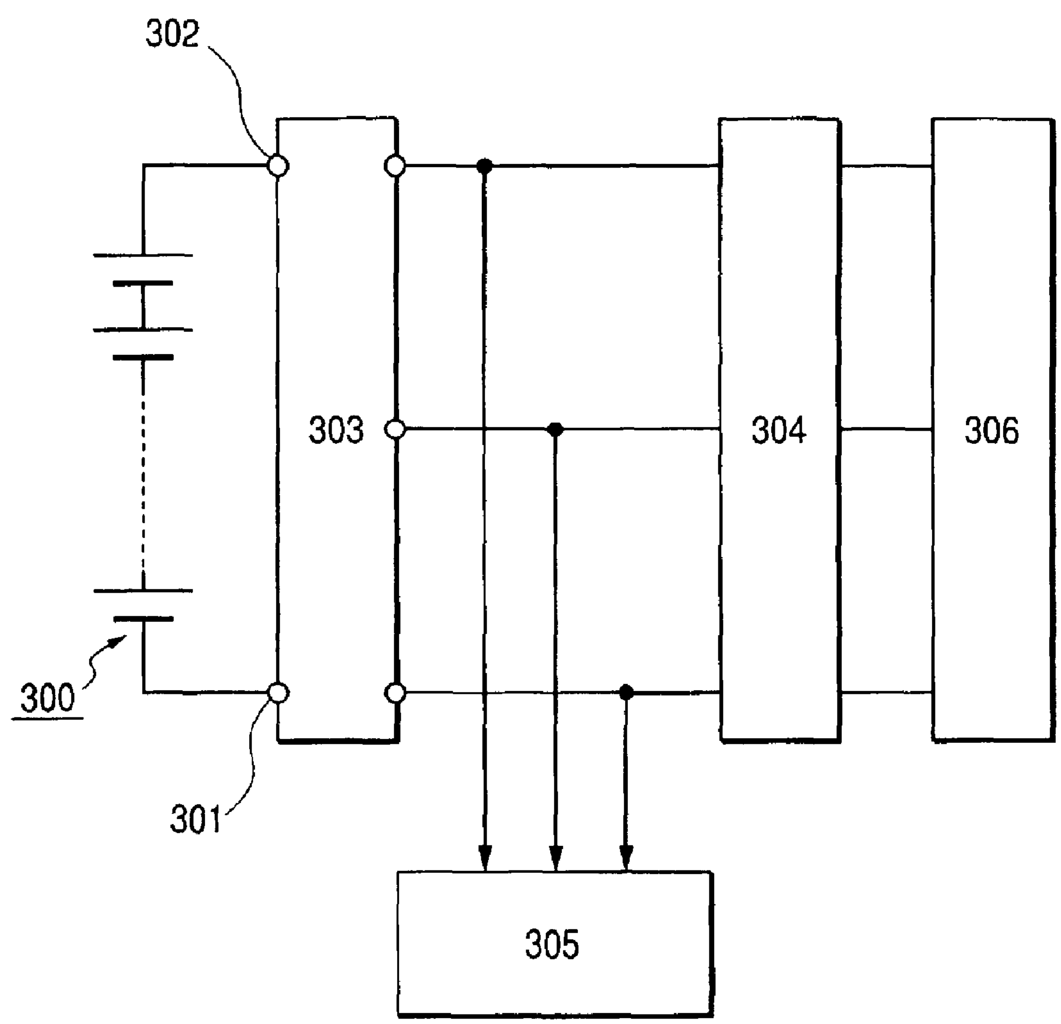
FIG. 3 is a diagrammatic view showing an example of the photovoltaic power generation system of the present invention.

Another preferred embodiment of the present invention is shown in FIG. 3. In FIG. 3, reference numeral 300 denotes a solar-battery string comprising a plurality of solar-cell modules; 303, a non-insulation type inverter; 304, a circuit breaker having an electrical-leak breaker; 305, a load; and 306, a commercial power system. Also, reference numeral 301 denotes the direct-current-side negative-pole terminal of the inverter 303; and 302, the direct-current-side positive-pole terminal of the inverter 303; which are connected with the negative-pole terminal and the positive-pole terminal, respectively, of the solar-battery string 300.

A preferred inverter used in this Embodiment is one in which the voltage to ground of the direct-current-side positive-pole terminal 302 or direct-current-side negative-pole terminal 301 is kept controlled to a constant value.

For example, where the voltage to ground of the direct-current-side negative-pole terminal 301 is so kept controlled as to come to $V_4$ and the potential difference between the positive-pole terminal and the negative-pole terminal at the time of maximum output of the solar-battery string 300 is $V_5$, the string is so designed as to satisfy the relationship of $V_4<0$ and $2V_4+V_5>0$ (in this case, it follows that the relationship of $V_4+V_5>0$ is necessarily satisfied). On the other hand, where the voltage to ground of the direct-current-side positive-pole terminal 302 is so kept controlled as to come to $V_6$ and the potential difference between the positive-pole terminal and the negative-pole terminal at the time of maximum output of the solar-battery string 300 is $V_5$, the string is so designed as to satisfy the relationship of $V_6-V_5<0$ and $2V_6-V_5>0$ (in this case, it follows that the relationship of $V_6>0$ is necessarily satisfied).

Thus, the maximum value of the Eff. produced when any closed loop of direct current has unintentionally been formed via the ground and human body at the time of maximum output of the solar-battery string 300 can be made small.

In this Embodiment, the maximum value of the Eff. becomes smaller than that at the time of maximum output of the solar-battery string when the string is not at the maximum output.

In this Embodiment, an inverter of a three-phase alternating-current system is used. Instead, an inverter of, e.g., a two-phase alternating-current system may also be used (the same applies also in the following Embodiments.)

(Embodiment 3)

Figure 4:
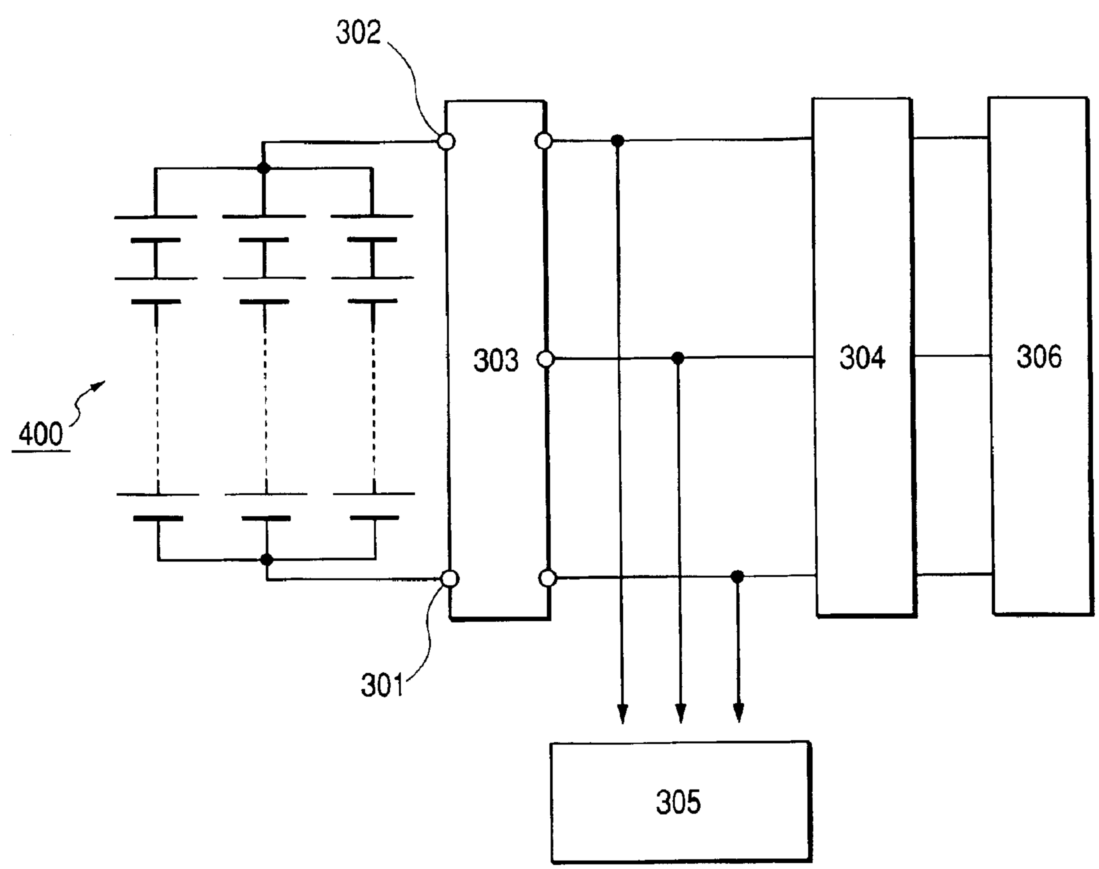
FIG. 4 is a diagrammatic view showing another example of the photovoltaic power generation system of the present invention.

Still another preferred embodiment of the present invention is shown in FIG. 4. This Embodiment is a modification of Embodiment 2, and is the same as Embodiment 2 except that the solar-battery string 300 shown in FIG. 3 has been changed to a solar-battery array (solar-battery array in a narrow sense) 400.

In this Embodiment, too, where the voltage to ground of the direct-current-side negative-pole terminal 301 is so kept controlled as to come to $V_4$ and the potential difference between the positive-pole terminal and the negative-pole terminal at the time of maximum output of the solar-battery array 400 is $V_5$, the array is so designed as to satisfy the relationship of $V_4<0$ and $2V_4+V_5>0$. On the other hand, where the voltage to ground of the direct-current-side positive-pole terminal 302 is so kept controlled as to come to $V_6$ and the potential difference between the positive-pole terminal and the negative-pole terminal at the time of maximum output of the solar-battery array 400 is $V_5$, the array is so designed as to satisfy the relationship of $V_6-V_5<0$ and $2V_6-V_5>0$.

(Embodiment 4)

Figure 5:
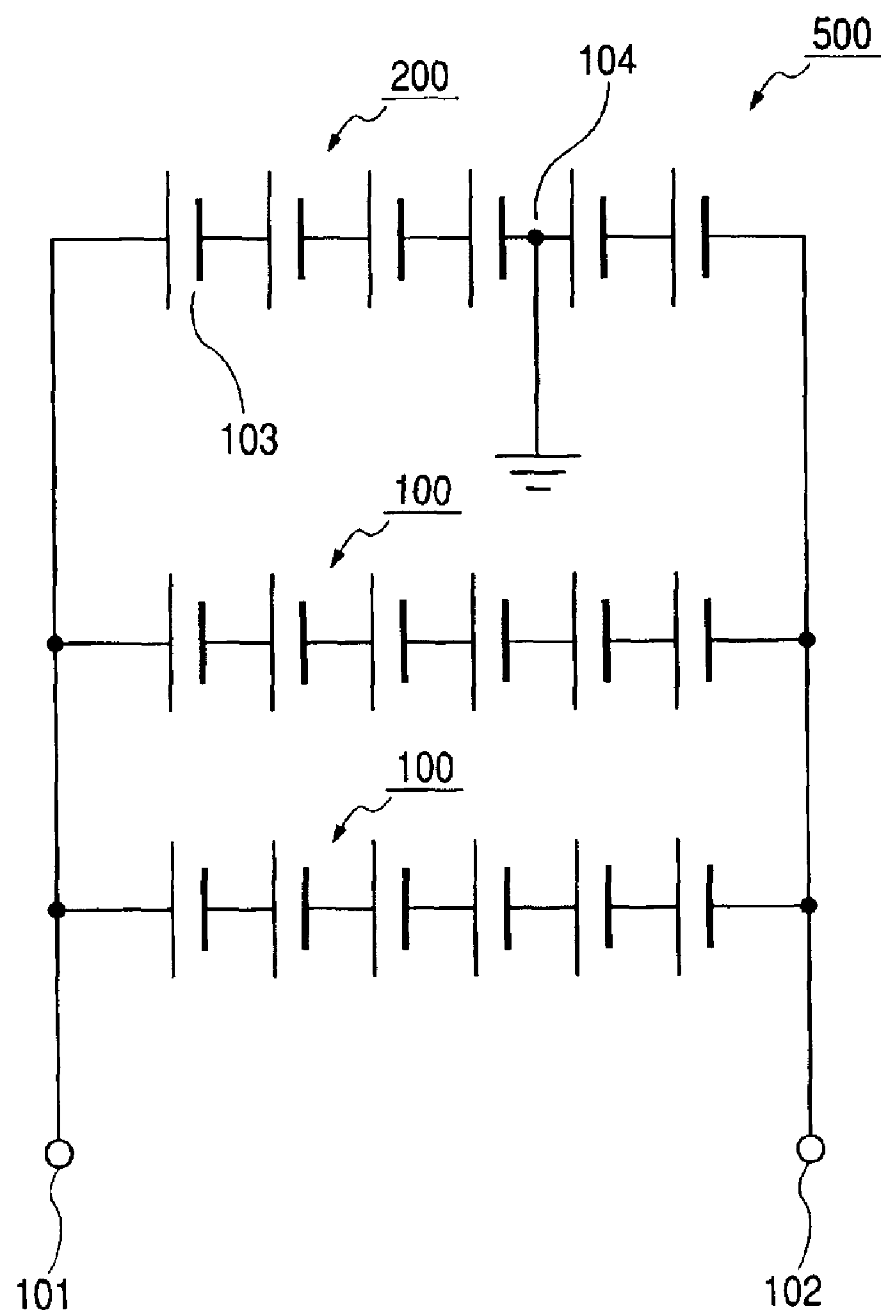
FIG. 5 is a diagrammatic view showing an example of the solar-battery array of the present invention.

Still another preferred embodiment of the present invention is shown in FIG. 5. This Embodiment is a modification of Embodiment 1, and is an example of a solar-battery array 500 (in a narrow sense).

As shown in FIG. 5, the array 500 of this Embodiment is an array in which one solar-battery string 200 and two solar-battery strings 100 are connected in parallel. Then, this array 500 is grounded only at one point 104 in the string 200, and is not grounded at other points (the points where the voltage to ground is 0) in other strings. Also, this grounding point 104 is, like that in Embodiment 1, a point on the electric circuit, located between modules which are second and third as counted from the negative-pole side of the string. The reason why the array 500 is grounded only at one point therein is that if plural points are grounded then there is a possibility of forming a closed loop of direct current via the ground when the outputs of individual modules vary.

Designing as shown in FIG. 5 can make smallest the maximum value of the Eff. at the time of maximum output and can make smallest the effects an electric shock may have on the heart when you touch some part of the electric circuit of the solar-battery array 500. Even when the array is not at the maximum output, the maximum value of the Eff. can be made smallest as long as the output voltages of all the solar-cell modules are equal.

However, if the output voltages of only some solar-cell modules in the string 200 have decreased because of any effects of partial shade or trouble of modules, the voltage to ground of the positive-pole terminal 101 and the voltage to ground of the negative-pole terminal 102 may vary to make the maximum value of the Eff. large. Accordingly, the string 200 may preferably be installed at a place which is not easily shaded, compared with other strings. Also, voltmeters (not shown) may be provided between the positive-pole terminal 101 and the ground and between the negative-pole terminal 102 and the ground, and the corresponding outputs may be inputted to an operating unit (of a computer) so that the maximum value of the Eff. may be calculated by the operating unit and, when the value exceeds a preset value, any warning by sound or light may be given from a warning device (not shown). Also, the sum of the voltage to ground of the positive-pole terminal and the voltage to ground of the negative-pole terminal may be found on the operating unit so that the warning may be given from the warning device when the sum comes to 0 or less. Alternatively, a switch (not shown) may be so provided on the electric circuit of the string so that the electrical interconnection between solar batteries constituting the string can be broken off, and the switch may be opened in place of giving the warning.

Like the string 200 of Embodiment 1, the array 500 may be connected to an inverter, a load and so forth. Also, in the array 500 of this Embodiment, one solar-battery string 200 and two solar-battery strings 100 are connected in parallel. The number of the strings 100 connected in parallel is by no means limited to two.

(Embodiment 5)

Figure 6:
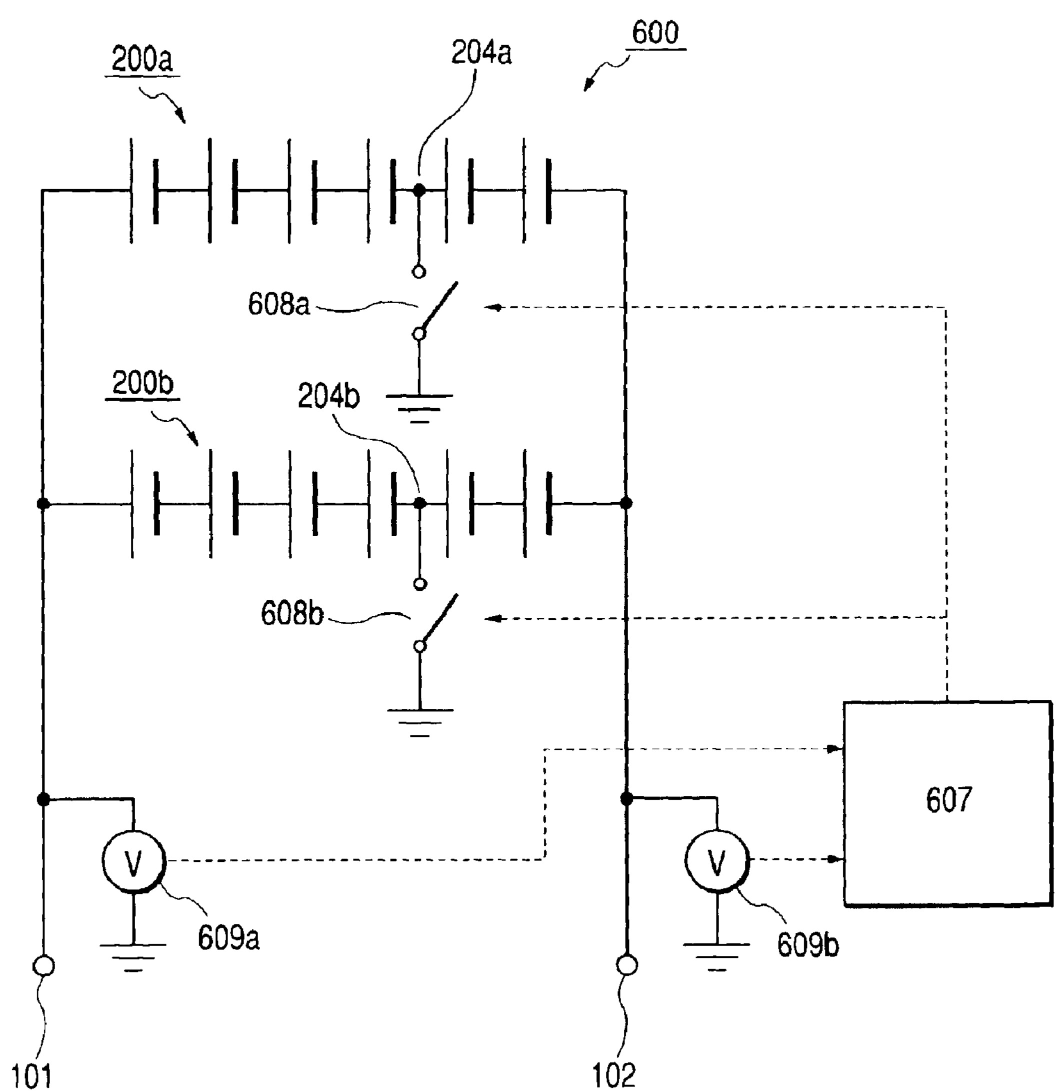
FIG. 6 is a diagrammatic view showing another example of the solar-battery array of the present invention.

Still another preferred embodiment of the present invention is shown in FIG. 6. This Embodiment is a modification of Embodiment 4.

An array 600 shown in FIG. 6 is an array in which a solar-battery string **200*a* and a solar-battery string 200*b* are connected in parallel, in the former of which a point 204*a* and the ground are connected via a switch 608*a* and in the latter of which a point 204*b* and the ground are connected via a switch 608*b***.

In this array, usually the switch **608*a* is kept closed and the switch 608*b* is kept open. Also, the voltage to ground of the positive-pole terminal 101 is monitored with a voltmeter 609*a* and the voltage to ground of the negative-pole terminal 102 is monitored with a voltmeter 609*b*. These voltages to ground are inputted to a switch control unit 607. Then, in the switch control unit 607, the sum of the voltage to ground of the positive-pole terminal and the voltage to ground of the negative-pole terminal are calculated. When this value comes to 0 or less, control is performed to open the switch 608***a* and close the switch 608*b*. In the state in which the switch 608*b* is closed, when the sum of the voltage to ground of the positive-pole terminal and the voltage to ground of the negative-pole terminal comes to 0 or less, control is conversely performed to close the switch 608*a* and open the switch 608*b*.

When the sum of the voltage to ground of the positive-pole terminal and the voltage to ground of the negative-pole terminal is still 0 or less even after such control, a warning may be given from a warning device (not shown). Also, where mechanical switches are used as the switches, there is a possibility that the switches deteriorate if they are opened and closed many times in a short time. Accordingly, it is preferable not to operate the switches for at least 10 seconds after the switches have been operated once. Also, where there is no possibility at all that you touch the electric circuit, the control unit 607 may be kept stopped.

In this Embodiment, two strings are connected in parallel to set up an array. Instead, many more strings may be connected in parallel to form an array. In the latter case, switches are so controlled that only one of them is kept open. Also, where switches 608*a*, 608*b*, 608*c* and 608*d* are provided as the switches and when the sum of the voltage to ground of the positive-pole terminal and the voltage to ground of the negative-pole terminal comes to 0 or less, switches which become closed in order may be selected (e.g., so selected that 608*a* is followed by 608*b*, 608*b* is followed by 608*c*, 608*c* is followed by 608*d* and 608*d* is followed by 608*a*). This is preferable in order to immediately find the point where the sum of the voltage to ground of the positive-pole terminal and the voltage to ground of the negative-pole terminal exceeds 0. Also, in the case when mechanical switches are used, such orderly selection enables the switches to be kept from deteriorating.

(Embodiment 6)

Figure 7:
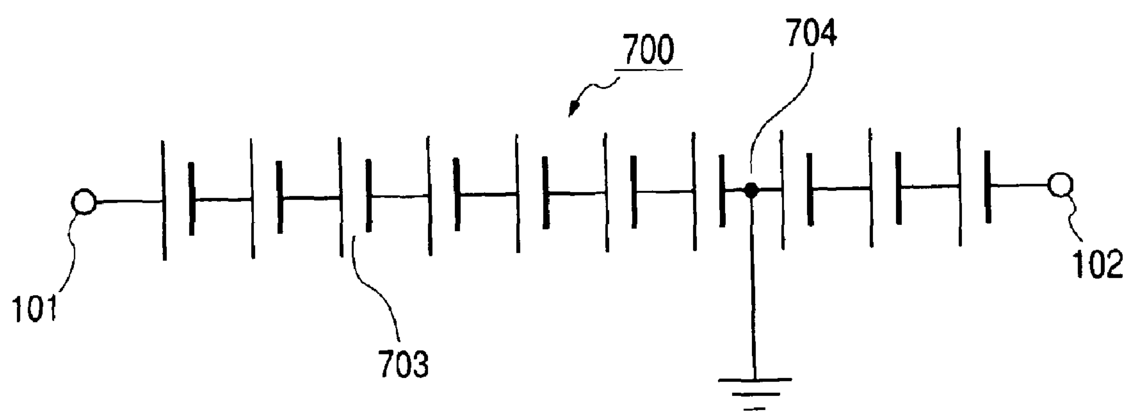
FIG. 7 is a diagrammatic view showing an example of a solar-battery string which is an example of the solar-battery array of the present invention.

In this Embodiment, as shown in FIG. 7, ten solar-cell modules 703 which are so designed as to have the same output characteristics (maximum output voltage $V_3$) are connected in series to set up a solar-battery string 700.

In an attempt to determine the grounding point so as to satisfy $V_1+2V_2=0$ where the voltage to ground of the positive-pole terminal at the time of maximum output of this solar-battery string is represented by $V_1$, and the voltage to ground of the negative-pole terminal at the time of maximum output of the solar-battery string by $V_2$, it follows that the string is grounded at its point inside the modules. It is difficult to do so. Accordingly, in order to set smallest the maximum value of the Eff. on the condition that the string can not be grounded at any point inside the modules, a point which satisfies the relationship of $V_1+2V_2-2V_3<0<V_1+2V_2+V_3$ among points on the electric circuit between the modules is determined as the grounding point.

Stated specifically, where the string shown in FIG. 7 is grounded at a point on its electric circuit, located between modules which are n-th and n+1-th from the positive-pole terminal 101 side, it follows that $V_1=nV_3$ and $V_2=(n-10)V_3$. Therefore, $V_1+2V_2-2V_3\leqq 0\leqq V_1+2V_2+V_3$ comes to be $nV_3+2\ (n-10)V_3-2V_3\leqq 0\leqq nV_3+2(n-10)V_3+V_3$, where, since $V_3>0$, it follows that $19\leqq 3n\leqq 22$. Since n is a natural number, it follows that n=7.

Accordingly, in this Embodiment, the string is grounded at a point 704 located between modules which are seventh and eighth from the positive-pole terminal 101 side.

The Embodiments described above are also simply applicable to any other arrays or systems on the basis of the same way of thinking as the above. For example, the ways of thinking in Embodiments 3, 4 and 5 are applicable to those in which solar-battery strings are connected in parallel and also to solar-battery arrays in which additional solar-battery strings are further connected in series. Also, the way of thinking in Embodiment 6 is easily applicable also to a case in which solar-cell modules having different outputs are connected with one another. Still also, needless to say, the way of thinking in Embodiment 6 is applicable also to a case in which the number of the modules connected in series in the strings constituting the arrays of Embodiments 1, 4 and 5 is not a multiple of 3.

In the foregoing Embodiments, solar-cell modules are used as constituents of the solar-battery array. Instead, solar cells not made into modules may also be used. Besides these, the foregoing Embodiments are modifyable in variety.

As described above, according to the present invention, the effects an electric shock may have on the heart when your hand touches electric circuits of solar-battery arrays can be lessened.

What is claimed is:

1. A solar-battery array comprising a plurality of solar batteries, which solar-battery array satisfies the relationship of $V_2<0$ and $V_1+V_2>0$, where $V_1$ is the voltage to ground of the positive-pole terminal at the time of maximum output of the solar-battery array, and $V_2$ is the voltage to ground of the negative-pole terminal at the time of maximum output of the solar-battery array, wherein a solar battery of said plurality of solar batteries has an electric circuit covered with a resin, a glass plate, or a steel sheet such that the electric circuit is not exposed to the outside.

2. The solar-battery array according to claim 1, which satisfies the relationship of $V_1+2V_2=0$.

3. The solar-battery array according to claim 1, wherein a point at which the voltage to ground is 0 is present on an electric circuit which is not inside a solar battery, and the absolute value of $V_1+2V_2$ is not more than the absolute value of $V_1+2V_2$ found when the voltage to ground of any other point on an electric circuit which is not inside a solar battery is 0.

4. The solar-battery array according to claim 1, wherein the potential difference between positive pole and negative pole at the time of maximum output of an individual solar battery which constitutes the solar-battery array is $V_3$ and satisfies the relationship of $V_1+2V_2-2V_3\leqq 0\leqq V_1+2V_2+V_3$.

5. The solar-battery array according to claim 1, wherein, among individual solar batteries which constitute the solar-cell array, the potential difference between positive pole and negative pole at the time of maximum output of solar batteries having a point at which the potential at the time of maximum output comes to $(V_1 2V_2)/3$ is $V_3$, and satisfies the relationship of $V_1+2V_2-2V_3\leqq 0\leqq V_1+2V_2+V_3$.

6. The solar-battery array according to claim 1, which is grounded at a point at which the voltage to ground is 0.

7. The solar-battery array according to claim 6, wherein there are a plurality of points at which the voltage to ground is 0, and wherein the solar-battery array is grounded at only one point thereof.

8. The solar-battery array according to claim 1, which has at least a part where a plurality of solar-battery strings comprising a plurality of solar batteries connected in series are connected in parallel.

9. The solar-battery array according to claim 8, wherein the plurality of solar-battery strings respectively have points on an electric circuit at which points the strings are connected to the ground via switches, and only one of the switches is kept closed.

10. The solar-battery array according to claim 9, which further comprises voltmeters which measure the voltages to ground of the positive terminal and negative terminal of the solar-battery array, and a switch control unit which controls the opening or closing of the switches in accordance with the values the voltmeters have measured.

11. A photovoltaic power generation system comprising a solar-battery array comprising a plurality of solar batteries, and a load connected to the positive-pole terminal and negative-pole terminal of the solar-battery array, wherein the solar-battery array satisfies the relationship of $V_2<0$ and $V_1+V_2>0$, where $V_1$ is the voltage to ground of the positive-pole terminal at the time of maximum output of the solar-battery array, and $V_2$ is the voltage to ground of the negative-pole terminal at the time of maximum output of the solar-battery array, and wherein a solar battery of said plurality of solar batteries has an electric circuit covered with a resin, a glass plate, or a steel sheet such that the electric circuit is not exposed to the outside.

12. A photovoltaic power generation system comprising a solar-battery array comprising a plurality of solar batteries, and an inverter which is connected to the positive-pole terminal and negative-pole terminal of the solar-battery array and changes direct-current output of the solar-battery array to alternating-current output, wherein the solar-battery array satisfies the relationship of $V_2<0$ and $V_1+V_2>0$, where $V_1$ is the voltage to ground of the positive-pole terminal at the time of maximum output of the solar-battery array, and $V_2$ is the voltage to ground of the negative-pole terminal at the time of maximum output of the solar-battery array, and wherein a solar battery of said plurality of solar batteries has an electric circuit covered with a resin, a glass plate, or a steel sheet such that the electric circuit is not exposed to the outside.

13. The photovoltaic power generation system according to claim 12, which further comprises a transformer provided on the inside or outside of the inverter.

14. A photovoltaic power generation system comprising a solar-battery array comprising a plurality of solar batteries, and an inverter which is connected to the solar-battery array and changes direct-current output of the solar-battery array to alternating-current output, wherein the solar-battery array has a point at which the voltage to ground at the time of maximum output of the solar-battery array is 0 V. the point being located between the negative-pole terminal of the solar-battery array and the electrical middle point of the solar-battery array at the time of its maximum output, and wherein a solar battery of said plurality of solar batteries has an electric circuit covered with a resin, a glass plate, or a steel sheet such that the electric circuit is not exposed to the outside.

15. The photovoltaic power generation system according to claim 14, wherein the solar-battery array is grounded at a point at which the voltage to ground is 0.

16. The photovoltaic power generation system according to claim 14, wherein one of direct-current-side terminals of the inverter has a constant voltage to ground.

* * * * *

UNITED STATES PATENT AND TRADEMARK OFFICE
CERTIFICATE OF CORRECTION

PATENT NO. : 6,884,934 B2
DATED : April 26, 2005
INVENTOR(S) : Hidetoshi Tsuzuki et al.

It is certified that error appears in the above-identified patent and that said Letters Patent is hereby corrected as shown below:

Title page,
Item [56], References Cited, U.S. PATENT DOCUMENTS,
"6,703,555 B1" should read -- 6,703,555 B2 --.

Column 5,
Line 60, "connected-as" should read -- connected as --.

Column 10,
Line 53, "$(V_1 2V_2)/3$"should read -- $(V_1+2V_2)/3$ --.

Column 12,
Line 17, "0 V." should read -- 0 V, --.

Signed and Sealed this

Seventh Day of February, 2006

JON W. DUDAS
*Director of the United States Patent and Trademark Office*